United States Patent [19]

Matsumura

[11] Patent Number: 5,172,013
[45] Date of Patent: Dec. 15, 1992

[54] SUBSTRATE BIAS GENERATOR FOR SEMICONDUCTOR DEVICES

[75] Inventor: Youichi Matsumura, Kanagawa, Japan

[73] Assignee: Sony Corporation, Tokyo, Japan

[21] Appl. No.: 720,736

[22] Filed: Jun. 25, 1991

[30] Foreign Application Priority Data

Jun. 25, 1990 [JP] Japan .................. 2-164289

[51] Int. Cl.[5] ............................................... H03K 3/01
[52] U.S. Cl. ........................... 307/296.2; 307/296.1; 307/296.8; 307/296.6
[58] Field of Search ............... 307/296.1, 296.2, 296.8, 307/296.6

[56] References Cited

U.S. PATENT DOCUMENTS

| | | | |
|---|---|---|---|
| 4,471,290 | 9/1984 | Yamaguchi | 307/296.2 |
| 4,794,278 | 12/1988 | Vajdic | 307/296.2 |
| 4,843,256 | 6/1989 | Scade et al. | 307/296.2 |
| 4,920,280 | 4/1990 | Cho et al. | 307/269.2 |
| 4,961,007 | 10/1990 | Kumanoya et al. | 307/296.2 |
| 5,041,739 | 8/1991 | Goto | 307/296.2 |

*Primary Examiner*—John S. Heyman
*Assistant Examiner*—Scott A. Ouellette
*Attorney, Agent, or Firm*—Hill, Van Santen, Steadman & Simpson

[57] ABSTRACT

A substrate bias generator for supplying a predetermined substrate bias voltage to a semiconductor device includes a charge circuit in which there is provided a rectifying pMOS transistor formed in an n-well. The n-well is maintained at a negative voltage level during the pumping operation. As a result, the threshold voltage of the rectifying pMOS transistor is prevented from increasing to enable the bias volatge to be supplied at a higher efficiency.

3 Claims, 4 Drawing Sheets

SUBSTRATE BIAS GENERATOR FOR SEMICONDUCTOR DEVICES

BACKGROUND OF THE INVENTION

1. Field of the Invention

This invention relates to a substrate bias generator enclosed in a semiconductor integrated circuit device, such as a memory.

2. Description of the Prior Art

In a semiconductor integrated circuit device, such as a memory, a substrate voltage $V_{BB}$ in the order of $-2$ to $-3.5$ V is supplied to a semiconductor substrate for effectively retaining data stored in memory cells. This substrate voltage $V_{BB}$ is set so as to be at a value lower than the ground voltage (0 V) and is supplied to the substrate by a pumping operation by capacitors, as disclosed for example in Japanese Patent KOKAI (Laid-Open) Publication No. 1-154395(1989).

FIG. 1 shows an example of the conventional substrate bias generator. An oscillator, not shown, supplies anti-phase clock pulses by means of inverters 7 and 8 to a pair of capacitors 1 and 2, each formed by a pMOS transistor, so that these capacitors 1 and 2 will perform alternate charge-pumping operations. Rectifying pMOS transistors 3 and 4 are connected to a terminal $P_0$ of the capacitor 1 and a terminal $Q_0$ of the capacitor 2, respectively, while being connected in common to a mode 9 from which the substrate voltage $V_{BB}$ is outputted. A pair of pMOS transistors 5 and 6 for discharging to a grounding line, which is at 0 V or at the GND level, are connected to the terminal $P_0$ and $Q_0$, respectively.

The operation of the above described circuit is hereinafter explained briefly. It is first assumed that, with the level of the terminal $R_0$ of the capacitor 1 at the "H" level, or at 5 V, and with the terminal $P_0$ of the capacitor 1 at the GND level due to discharging by means of the pMOS transistor 5, the voltage level at the terminal $R_0$ has been shifted by the inverter 7 from the "H" level to the "L" level or to 0 V. The voltage level at the terminal $P_0$ of the capacitor 1 is lowered at this time from approximately 0 V to close to $-5$ V. However, when the voltage level exceeds the threshold voltage Vth of the pMOS transistor 3, the pMOS transistor 3 is turned on. Simultaneously, the gate voltage of the pMOS transistor 5 is at the voltage level at the terminal $Q_0$, so that the transistor 4 is turned off. Thus the voltage level at the terminal $P_0$ is raised by the current from the node 9 to a value in the vicinity of the substrate voltage $V_{BB}$ plus threshold voltage ($V_{BB}$+Vth). When the voltage at the terminal $R_0$ shifts to the "H" level, the voltage level at the terminal $P_0$ is also raised so as to follow the voltage shift at the terminal $R_0$. Thus the pMOS transistor 3 is turned off, while the pMOS transistor 5 is turned on, as a result of which the voltage at the terminal $P_0$ is again reset to close to the ground level. Such charge pumping operation occurs simultaneously with the capacitor 2 and the pMOS transistors 5 and 6, so that substrate charges are drained alternately from the node 9 by means of pMOS transistors 5 and 6 to maintain a predetermined value of the substrate voltage $V_{BB}$.

However, the conventional circuit shown in FIG. 1 is inconvenient in that its pumping efficiency can not be raised sufficiently.

That is, while the pMOS transistor 3 is formed in an n-well on the p-type semiconductor substrate, the n-well is connected to the terminal $R_0$, as shown in FIG. 1, and is alternately supplied with the source voltage Vcc and the ground voltage GND. However, if our attention is directed to the pMOS transistor 3, the voltage level at the node 9 is approximately $-2$ to $-3$ V almost steadfastly, so that, during the turn-on period of the transistor 3, the n-well voltage becomes higher about 2 to 3 V than the source voltage. As a result, the threshold voltage Vth of the pMOS transistor 3 is raised. Referring to FIG. 2, which is a waveform diagram of the circuit shown in FIG. 1, while the voltage at the terminal $P_0$ becomes fixed at a level lower than the substrate voltage $V_{BB}$ by the threshold voltage $Vth_0$ for the low voltage level at the terminal $R_0$, the larger the threshold voltage $Vth_0$, the higher becomes the rate of decrease of the amount of charges passing through the pMOS transistor 3, so that the charge draining efficiency at the mode 9 is correspondingly lowered. The same also applies to the pMOS transistor 4.

OBJECT AND SUMMARY OF THE INVENTION

It is an object of the present invention to provide a substrate bias generator capable of performing a pumping operation at a higher efficiency.

In one aspect of the present invention, there is provided a substrate bias generator comprising a substrate level detector for detecting the voltage level of a substrate, an oscillator operated in accordance with the results of detection by said substrate level detector, and a pumping circuit including a rectifying p-channel MOS transistor formed in an n-well which is maintained at a negative voltage level during pumping. Since the n-well is maintained at the negative voltage, the threshold voltage of the rectifying pMOS transistor may be prevented from increasing to enable a high efficiency charge pumping operation.

In another aspect of the present invention, a charge pumping circuit for the n-well in provided for maintaining the negative voltage level of the n-well in which the rectifying p-channel MOS transistor is formed. The charge pumping circuit for the well may be adapted to be driven by the same signals from the oscillator as those driving the pumping circuit. The parasitic capacity between the well and the MOS transistor may be used to effect the pumping operation.

DETAILED DESCRIPTION OF PREFERRED EMBODIMENT

A substrate bias generator according to a preferred embodiment of the present invention, employed in a dynamic RAM, is hereinafter explained by referring to FIG. 3.

Figure 3:
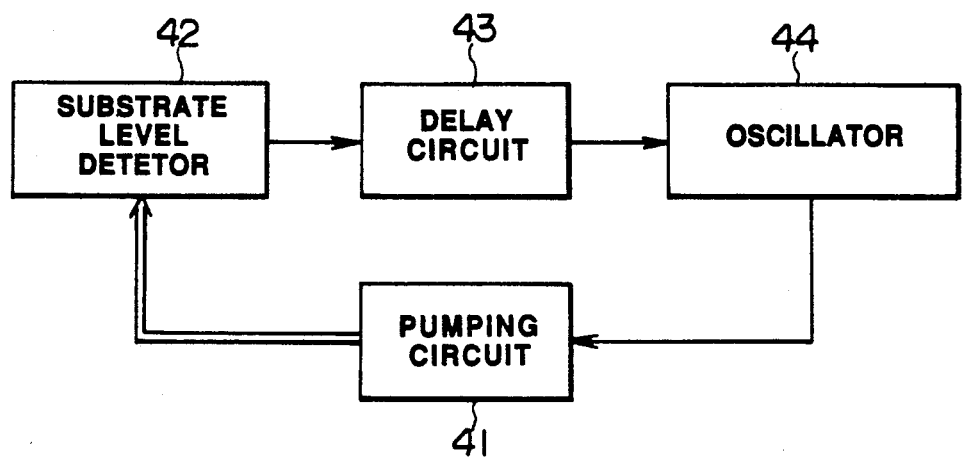
FIG. 3 is a block diagram showing an embodiment of an overall substrate bias circuit according to the present invention.

Referring to FIG. 3, the substrate bias generator is constituted by a pumping circuit 41 for supplying a substrate voltage $V_{BB}$ by a charge pumping operation, a substrate level detector 42 for detecting whether the substrate voltage $V_{BB}$ is a predetermined voltage, a delay circuit 43 for delaying the signal indicating the result of detection, and an oscillator 43 adapted for starting its oscillation by a signal from the delay circuit 43. With the present substrate bias generator, when the substrate voltage $V_{BB}$ has been raised to higher than a predetermined voltage, the substrate level detector 42 outputs a signal conforming to the result of detection. This signal is supplied by means of the delay circuit 43 composed for a multi-stage inverter to the oscillator 44 where rectangular wave signals of a predetermined frequency are generated. These rectangular wave signals are amplified and transmitted to a pumping circuit 41 as later described. By the operation of the pumping circuit 41, the substrate voltage $V_{BB}$ at a predetermined voltage value is supplied to a substrate, not shown, on which a memory core of a dynamic memory and peripheral circuits are formed. When the substrate voltage $V_{BB}$ falls to lower than the predetermined voltage, the substrate level detector 42 detects such voltage decrease, so that oscillation at the oscillator 44 is brought to a stop by the signal from the detector 42.

Figure 4:
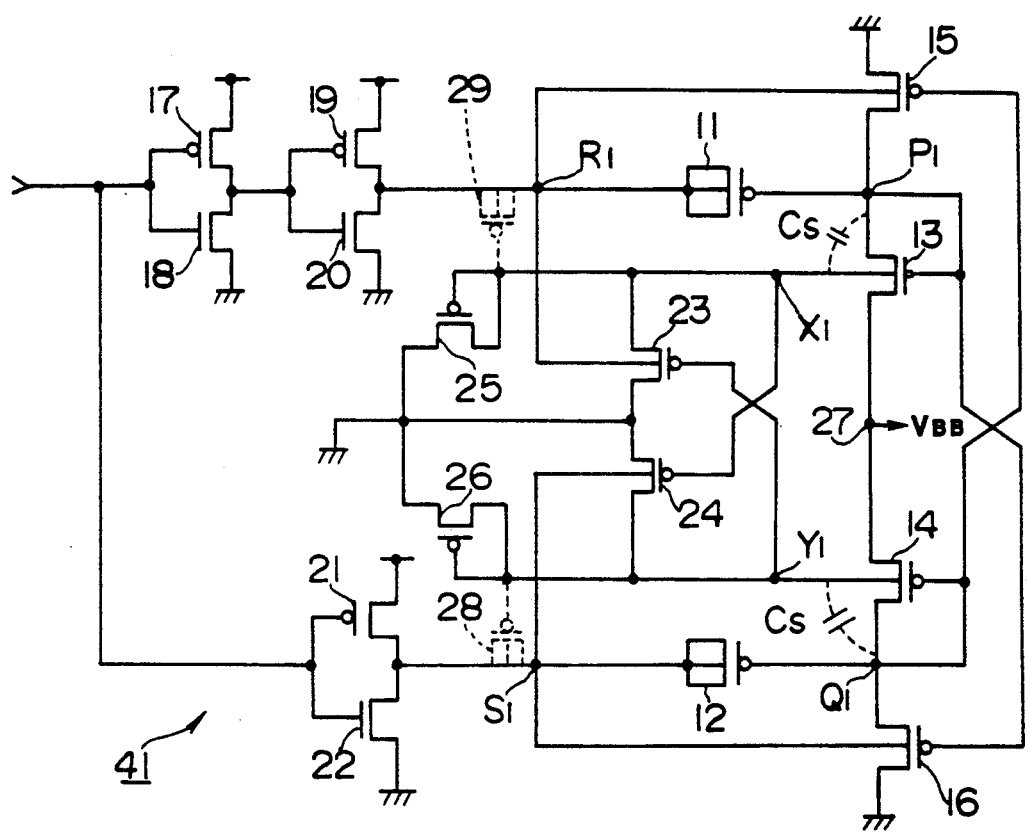
FIG. 4 is a circuit diagram showing a concrete circuit arrangement of a pumping circuit of the substrate bias circuit shown in FIG. 3.

The circuit arrangement of the pumping circuit 41, which is essential to the present embodiment, is explained by referring to FIG. 4.

In this figure, the pumping circuit 41 includes capacitors 11 and 12, each formed by a pMOS transistor. These capacitors are formed by connecting the source drain and channels regions of the pMOS transistors connected in common to form nodes $R_1$ and $S_1$ as one terminals, with gate side nodes $P_1$ and $Q_1$ as the other terminals. Rectangular wave signals, produced by the oscillator 44, are supplied to the nodes $R_1$ and $S_1$ of the capacitors 11 and 12 by means of amplifier-inverters. Thus the rectangular wave signals are supplied to the node $R_1$ of the capacitor 11 by means of a two-stage inverter consisting of an inverter composed of a pMOS transistor 17 and an nMOS transistor 18, and an inverter composed of a pMOS transistor 19 and an nMOS transistor 20. The rectangular wave signals are supplied to the node $S_1$ of the capacitor 12 by means of a single-stage inverter consisting of an inverter composed of a pMOS transistor 21 and an nMOS transistor 22. Because of the difference in the number of inverter stages, rectangular wave signals which are antiphase with respect to each other are supplied to the nodes $R_1$ and $S_1$ of the capacitors 11 and 12, respectively.

Rectifying pMOS transistor 13 and 14 are provided between the node $P_1$ of the capacitor 11 and the node 27 outputting the substrate voltage $V_{BB}$ and between the node $Q_1$ of the capacitor 12 and the node 27, respectively. One of the source or the drain of the pMOS transistor 13 is connected to the node $P_1$ of the capacitor 11 and the other of the source or the drain of the transistor 13 is connected to the node 27. One of the source or the drain of the pMOS transistor 14 is connected to the node $Q_1$ of the capacitor 12 and the other of the source or the drain of the transistor 14 is connected to the node 27. The gate of the pMOS transistor 13 is connected to the node $P_1$ and to the gate of the pMOS transistor 16. The gate of the pMOS transistor 14 is connected to the node $Q_1$ and to the gate of the pMOS transistor 15. Since the gates of the pMOS transistors 13 and 14 are connected to their drains, the transistors 13 and 14 act as rectifiers. It is noted that these pMOS transistors 13 and 14 are each formed in an n-well. Due to the parasitic capacity $C_S$ as later described, the n-well is maintained at a negative voltage to prevent the threshold voltage from increasing.

One of the source or the drain of the pMOS transistor 15 is connected to the node $P_1$, while the gate of the pMOS transistor 15 is connected to the node $Q_1$. One of the source or the drain of the pMOS transistor 16 is connected to the node $Q_1$, while the gate of the pMOS transistor 16 is connected to the gate $P_1$. The other of the source or the drain of each of the pMOS transistors 15 and 16 is supplied with the ground voltage GND. The voltages at the nodes $R_1$ and $S_1$ are supplied to the wells of the pMOS transistors 15 and 16. The pMOS transistors 15 and 16 function as resetting transistors for discharging the electrical charges at the nodes $P_1$ and $Q_1$ to grounding lines supplying the grounding voltage GND to clamp or reset the nodes $P_1$ and $Q_1$ at the grounding voltage GND.

In the present pumping circuit, pMOS transistors 23 to 26 are connected to n-wells $X_1$ and $Y_1$ of the pMOS transistors 13 and 14, so that the n-wells $X_1$ and $Y_1$ are maintained at the negative voltage by these pMOS transistors 23 to 26. The grounding voltage GND is supplied to one of the source or the drain of each of the pMOS transistors 23 to 26. To the n-well $X_1$ of the pMOS transistor 13 are connected the other of the source or the drain of the pMOS transistor 23, the gate of the pMOS transistor 24 and the gate as well as the other of the source or the drain of the pMOS transistor 25. To the n-well $Y_1$ of the pMOS transistor 14 are connected the other of the source or the drain of the pMOS transistor 24, the gate of the pMOS transistor 23 and the gate as well as the other of the source or the drain of the pMOS transistor 26. The well or the substrate, in which the channel of the pMOS transistor 23 is formed, is supplied with the voltage at the node $R_1$, whereas the well or substrate, in which the channel of the pMOS transistor 24 is formed, is supplied with the voltage at the node $S_1$.

With the above described circuit, a highly efficient pumping operation may be realized because the n-wells $X_1$ and $Y_1$ are maintained at the negative voltages due to the parasitic capacities $C_S$ proper to these n-wells.

Figure 1:
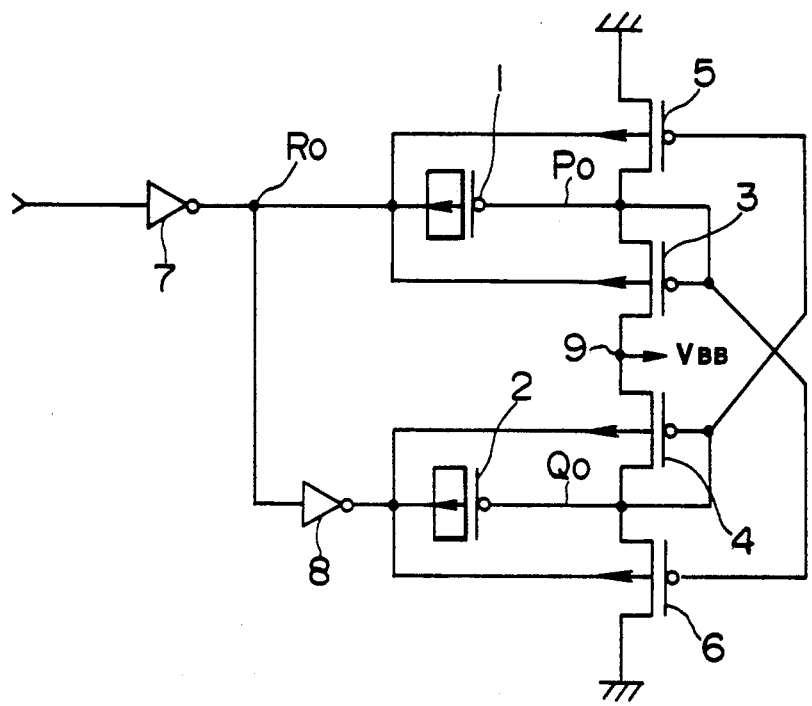
FIG. 1 is a circuit diagram of a pumping circuit in a conventional substrate bias circuit.
Figure 2:
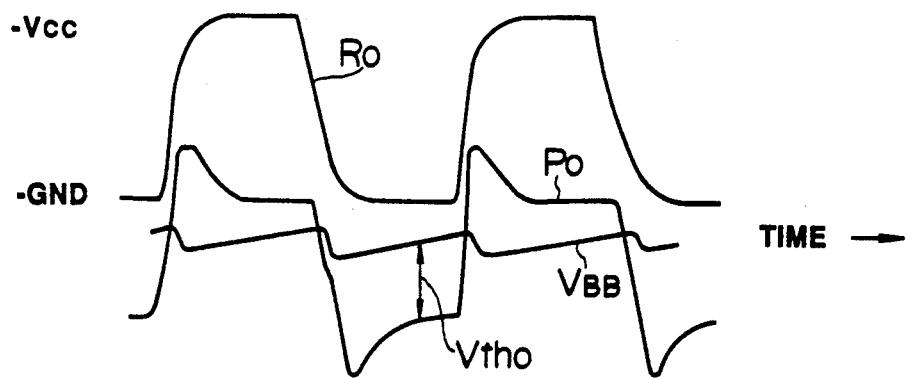
FIG. 2 is a waveform diagram for illustrating the pumping operation by the circuit shown in FIG. 1.
Figure 5:
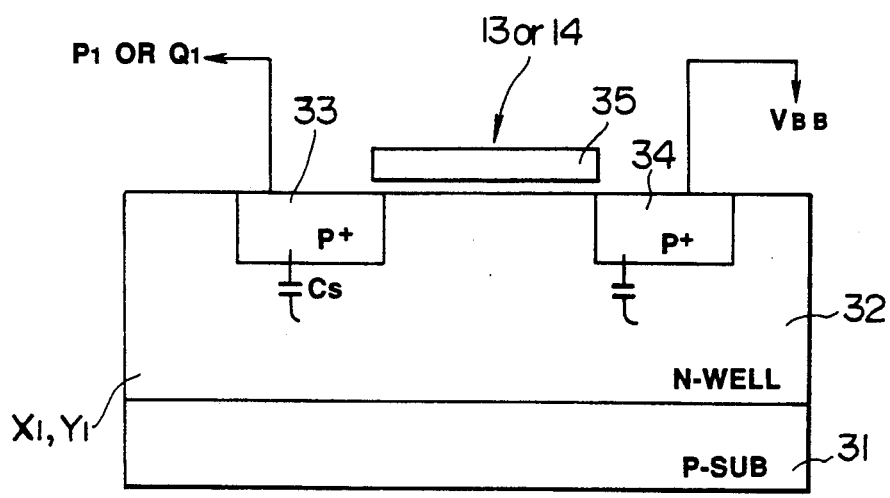
FIG. 5 is a cross-sectional view of the portion of a semiconductor chip mounting rectifying pMOS transistors for illustrating the relation of the n-well and the rectifying pMOS transistors according to the present invention.

Turning to FIG. 5 for illustrating the parasitic capacity $C_S$, an n-well 32 is formed on the n-type semiconductor substrate 31, and n-type impurity diffusion regions 33 and 34 are formed on the n-well 32 in isolation from each other. A gate electrode 35 in formed on a region between these p-type impurity diffusion regions 33 and 34 by the interposition of a gate insulating film, not shown. When these impurity diffusion regions 33 and 34 and the gate electrode 35 constitute the pMOS transistor 13 or 14 in the circuit of FIG. 1, the n-well 32 becomes the n-well $X_1$ or $Y_1$ in FIG. 4. The parasitic capacitance is formed at the junction between the n-well and each of the p type impurity diffusion regions 33 and 34. Above all, when the impurity diffusion region 33 is connected to the nodes $P_1$ and $Q_1$ in FIG. 4, the n-well 32 is affected by voltage changes at the nodes $P_1$ and $Q_1$, due to capacitive coupling by the parasitic capacity $C_S$ between the region 33 and the n-well 32. More specifically, as a result of the coupling by the parasitic capacity $C_S$, the n-well 32 acts as if it were driven by signals from the oscillator 44.

Figure 6:
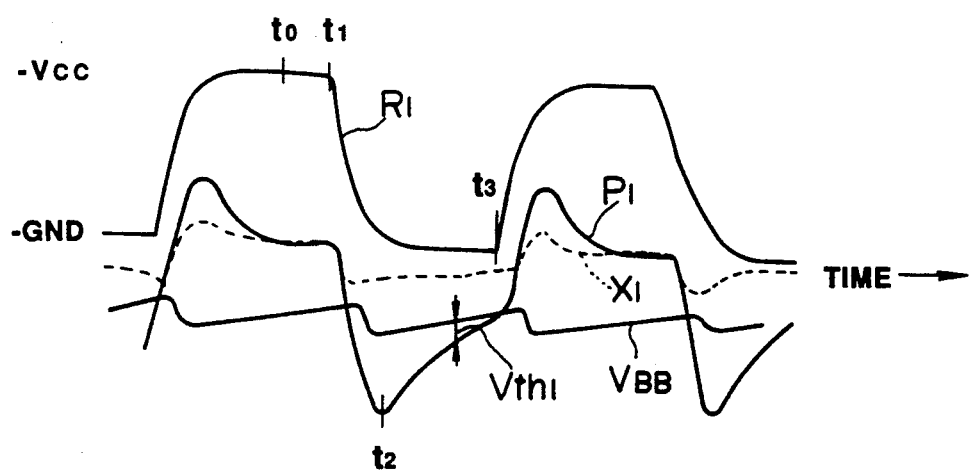
FIG. 6 is a waveform diagram for illustrating the pumping operation performed by the substrate bias circuit shown in FIG. 4.

Then, turning to FIG. 6, the operation of the pumping circuit shown in FIG. 4, above all, the operation of holding the negative voltage of the n-wells $X_1$ and $Y_1$ by the pMOS transistors 23 to 26, will be explained.

At time $t_0$, since the node $R_1$ is at the "H" level which is the Vcc level approximately equal to 5 V, while the node $P_1$ of the capacitor 11 is approximately at the grounding voltage GND, because the pMOS transistor 15 is in the current-conducting state. It is noted that the node $S_1$ on the opposite side is at the "L" level or GND level approximately equal to 0 V, whereas the node $Q_1$ is at a level lower than the GND level, such as at $-V_{BB}-Vth_1$, where $Vth_1$ is the threshold voltage of each of the pMOS transistors 13 and 14. At this time, the n-well $X_1$ is at a level close to the GND level.

At time $t_1$, the voltage level at node $R_1$ shifts from the "H" level to the "L" level or GND level, approximately equal to 0 V. by the signal from the oscillator 44. Then, by the capacitive coupling of the capacitor 11 by the pMOS transistor, the voltage level at the node $P_1$ is lowered from the level of the grounding voltage GND, such that, at time $t_2$, the voltage level at the node $P_1$ falls to a level close to, for example, $-5$ V, at time $t_2$.

Turning to the voltage level of the n-well $X_1$, the n-well $X_1$ follows the voltage level decrease at the node $P_1$, on account of the capacitive coupling due to the parasitic capacity $C_S$ between the n-well and the node $P_1$. Thus the voltage level at the n-well $X_1$ shifts from the level close to the GND level to the negative level, as shown by a dotted line in FIG. 6. With the n-well $X_1$ thus shifted to the negative voltage level, the pMOS transistor 24 is in the current-conducting state, while the voltage level at the opposite side n-well $Y_1$ is clamped or reset to the grounding voltage GND, even though it is raised under the influence of the parasitic capacity $C_S$ of the pMOS transistor 14. Since the gate voltage of the pMOS transistor 23 is not in excess of the threshold voltage Vth, the pMOS transistor 23 is in the turn-off state, so that the grounding voltage GND is not supplied at this stage to the n-well $X_1$ by means of the pMOS transistor 23. Thus the n-well $X_1$ is maintained at the negative voltage level. The pMOS transistor 25, acting as a diode, is in the current-conducting state when the voltage level at the n-well $X_1$ exceeds the threshold voltage Vth of the pMOS transistor 25. Thus the pMOS transistor 215 functions to prevent the voltage level at the n-well $X_1$ from decreasing excessively to prevent the forward current from flowing from the p-type semiconductor substrate towards the n-well $X_1$ as a consequence of the excessive decrease of the voltage level at the n-well $X_1$. It will be noted that the forward current tends to destruct DRAM data. When the n-well $X_1$ is maintained in this manner at the negative voltage level within a range in which the forward current is not generated with respect to the substrate, the threshold voltage $Vth_1$ of the pMOS transistor 13 is decreased in a manner as will be explained subsequently.

Turning to the state of the pMOS transistor 13 at time $t_2$, when the voltage level at the node $P_1$ is lowered to a level close to $-5$ V, the voltage level at the node $P_1$ is supplied to the gate of the transistor 13, so that the transistor is turned on and hence the current may flow from the node 27 towards the node $P_1$. When the circuit operates in this manner, the substrate voltage $V_{BB}$ is lowered. With the current flowing towards the node $P_1$, the voltage level at the node $P_1$ is raised. When the voltage level at the node $P_1$ becomes higher than the substrate voltage $V_{BB}$ or the source voltage less the threshold voltage $Vth_1$ of the pMOS transistor 13, the state of the pMOS transistor 13 is changed from the current-conducting or turn-on state to the turn-off state. It is noted that the threshold voltage $Vth_1$ of the pMOS transistor 13 has a small value, because the n-well $X_1$ is maintained at the negative voltage, as explained hereinabove. That is, since the voltage difference between the level at the n-well $X_1$ and the substrate voltage $V_{BB}$ is small, it becomes possible to prevent the threshold voltage from increasing. Thus, for the same voltage level at the node $P_1$, a larger current is allowed to flow through the pMOS transistor 13 and more charges may be carried off from the node 27 in proportion to the reduction in the threshold voltage $Vth_1$. It is noted that, at time $t_2$, since the voltage level at the node $Q_1$ or the gate of the pMOS transistor 14 is raised to a positive value, the pMOS transistor 14 is not rendered current conductive and, conversely, the pMOS transistor 16 is rendered current conductive, so that the current is allowed to flow from the mode $Q_1$ to the grounding voltage GND by means of the pMOS transistor 16.

After the pMOS transistor 13 is rendered non-conductive, the voltage level at the node $R_1$ shifts at the next time $t_3$ from the "L" level to the "H" level. The voltage level at the node $P_1$ capacitively coupled to the node $R_1$ also shifts by a value equal to the source voltage Vcc from the negative level which is equal to the substrate voltage $V_{BB}$ less the threshold voltage $Vth_1$ or $-(V_{BB}+Vth_1)$. As a result, the pMOS transistor 13 continues to be turned off and the pMOS transistor 15 is turned on, so that the voltage level at the node $P_1$ is changed towards the grounding level GND until it is reset to the state shown at time $t_0$. Turning to the pMOS transistors 23 to 26, the potential at the n-well $X_1$ is slightly raised to the positive side, with rise in voltage level at the node $P_1$, due to the capacitive coupling in the pMOS transistor 13. However, the n-well $Y_1$ is maintained at this time at the negative voltage due to the capacitive coupling of the pMOS transistor 14. Thus the pMOS transistor 23, the gate voltage of which is the voltage level at the n-well $Y_1$, is rendered conductive, so that the n-well $X_1$ is discharged immediately so as to be maintained at or near the grounding voltage GND.

The pumping circuit repeats the above described sequence of operations to supply the predetermined substrate voltage $V_{BB}$ from the node 27. Above all, with the present substrate bias generator, the n-well of the rectifying pMOS transistor is maintained during its operation at the negative voltage, the threshold voltage Vth of the trnsistor may be lowered for improving the pumping efficiency of the pumping circuit. Or in other words, the substrate voltage $V_{BB}$ may be at a lower value in proportion to the reduction of the threshold voltage of the rectifying pMOS transistor to improve data retention properties.

It is noted that, if a sufficient capacitance can not be obtained with the parasitic capacitance between the source-drain and the well of the pMOS transistors 13 or 14, it is possible to provide capacitors formed by pMOS transistors 28 and 29 between the node $S_1$ and the n-well $Y_1$ and between the node $R_1$ and the n-well $X_1$, respectively.

What is claimed is:

1. A substrate bias generator for generating a predetermined substrate bias voltage as required for a semiconductor device comprising, a substrate level detector for detecting a voltage level of a substrate, an oscillator for generating signals of a certain predetermined frequency responsive to results of detection by said substrate level detector, a pumping circuit operated by said signals from said oscillator for supplying a substrate bias voltage through a rectifying pMOS transistor formed in an n-well maintained at a negative voltage during operation of the pumping circuit, wherein said pumping circuit comprises a charge pumping circuit for maintaining the n-well at a negative voltage level during operation of the pumping circuit, said pumping circuit comprises first and second pMOS transistors which have sources, drains and channels thereof connected together to form one terminal and gates thereof forming a second terminal so as to form capacitors, an output of said oscillator connected to said second terminals of said first and second transistors, third and fourth pMOS transistors formed as rectifiers having gates connected to drains thereof and, respectively, to said second terminals of said first and second transistors, and said third and fourth transistors formed in a n-well and sources of said third and fourth transistors connected together and an output removed from the sources of said third and fourth transistors wherein a MOS transistor provides a capacitance between the charge pumping circuit and an input of said signals from said oscillator.

2. A substrate bias generator according to claim 1 including, fifth and sixth resetting transistors having sources and drains connected between ground and said gates of said third and fourth transistors respectively.

3. The substrate bias generator according to claim 1 wherein a parasitic capacitance is formed between said n-well and the separate drain-gate connections of said rectifying third and fourth pMOS transistors.

* * * * *